US007334326B1

(12) United States Patent  
Huemoeller et al.

(10) Patent No.: US 7,334,326 B1  
(45) Date of Patent: Feb. 26, 2008

(54) METHOD FOR MAKING AN INTEGRATED CIRCUIT SUBSTRATE HAVING EMBEDDED PASSIVE COMPONENTS

(75) Inventors: Ronald Patrick Huemoeller, Chandler, AZ (US); Sukitano Rusli, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 287 days.

(21) Appl. No.: 11/078,833

(22) Filed: Mar. 11, 2005

Related U.S. Application Data

(60) Division of application No. 10/319,022, filed on Dec. 12, 2002, now Pat. No. 6,987,661, which is a continuation-in-part of application No. 10/138,225, filed on May 1, 2002, now Pat. No. 6,930,256, and a continuation-in-part of application No. 09/884,193, filed on Jun. 19, 2001, now Pat. No. 6,967,124.

(51) Int. Cl.  
*H01K 3/10* (2006.01)

(52) U.S. Cl. ............... 29/852; 29/610.1; 29/830; 29/846; 29/25.03; 174/255; 174/260; 338/252; 361/780

(58) Field of Classification Search ............... 29/592.1, 29/601.1, 620, 832, 842, 846, 25.03, 25.42, 29/610.1, 848, 852; 174/257, 260, 255; 216/13, 17; 361/301.3, 301.4, 311, 328, 361/761–766, 780; 427/79, 96.1; 430/311–314; 338/252  
See application file for complete search history.

(56) References Cited

U.S. PATENT DOCUMENTS

| | | | |
|---|---|---|---|
| 3,868,724 A | 2/1975 | Perrino | 357/65 |
| 3,916,434 A | 10/1975 | Garboushian | 357/74 |
| 4,322,778 A | 3/1982 | Barbour et al. | |
| 4,532,419 A | 7/1985 | Takeda | 235/492 |
| 4,642,160 A | 2/1987 | Burgess | |
| 4,685,033 A | 8/1987 | Inone | |
| 4,706,167 A | 11/1987 | Sullivan | 361/406 |
| 4,716,049 A | 12/1987 | Patraw | 427/96 |

(Continued)

FOREIGN PATENT DOCUMENTS

JP 05-109975 4/1993

(Continued)

*Primary Examiner*—Minh Trinh  
*Assistant Examiner*—Donghai D. Nguyen  
(74) *Attorney, Agent, or Firm*—Gunnison, McKay & Hodgson, L.L.P.; Serge J. Hodgson

(57) ABSTRACT

A method for making an integrated circuit substrate having embedded passive components provides a reduced cost and compact package for a die and one or more passive components. An insulating layer of the substrate is embossed or laser-ablated to generate apertures for insertion of a paste forming the body of the passive component. A resistive paste is used to form resistors and a dielectric paste is used for forming capacitors. A capacitor plate may be deposited at a bottom of the aperture by using a doped substrate material and activating only the bottom wall of the aperture, enabling plating of the bottom wall without depositing conductive material on the side walls of the aperture. Vias may be formed to the bottom plate by using a disjoint structure and conductive paste technology. Connection to the passive components may be made by conductive paste-filled channels forming conductive patterns on the substrate.

19 Claims, 9 Drawing Sheets

U.S. PATENT DOCUMENTS

| | | | | |
|---|---|---|---|---|
| 4,786,952 | A | | 11/1988 | MacIver et al. ............ 357/23.4 |
| 4,811,082 | A | | 3/1989 | Jacobs et al. |
| 4,897,338 | A | | 1/1990 | Spicciati et al. ............ 430/314 |
| 4,905,124 | A | | 2/1990 | Banjo et al. ................ 361/395 |
| 4,912,844 | A | * | 4/1990 | Parker ......................... 29/848 |
| 4,964,212 | A | | 10/1990 | Deroux-Dauphin et al. .. 29/852 |
| 4,974,120 | A | | 11/1990 | Kodai et al. ................ 361/392 |
| 4,996,391 | A | | 2/1991 | Schmidt ..................... 174/255 |
| 5,021,047 | A | | 6/1991 | Movern |
| 5,055,966 | A | * | 10/1991 | Smith et al. ............. 361/321.3 |
| 5,072,075 | A | | 12/1991 | Lee et al. |
| 5,081,520 | A | | 1/1992 | Yoshii et al. ................. 357/80 |
| 5,108,553 | A | | 4/1992 | Foster et al. ................ 205/125 |
| 5,110,664 | A | | 5/1992 | Nakanishi et al. .......... 428/195 |
| 5,191,174 | A | | 3/1993 | Chang et al. |
| 5,229,550 | A | | 7/1993 | Birdra et al. |
| 5,239,448 | A | | 8/1993 | Perkins et al. |
| 5,247,429 | A | | 9/1993 | Iwase et al. ................... 362/29 |
| 5,283,459 | A | | 2/1994 | Hirano et al. ............... 257/419 |
| 5,371,654 | A | | 12/1994 | Beaman et al. ............. 361/744 |
| 5,379,191 | A | | 1/1995 | Carey et al. ................ 361/777 |
| 5,404,044 | A | | 4/1995 | Booth et al. |
| 5,463,253 | A | | 10/1995 | Waki et al. ................. 257/724 |
| 5,474,957 | A | | 12/1995 | Urushima ................... 437/209 |
| 5,474,958 | A | | 12/1995 | Djennas et al. ............. 437/211 |
| 5,508,938 | A | | 4/1996 | Wheeler |
| 5,530,288 | A | | 6/1996 | Stone ......................... 257/700 |
| 5,531,020 | A | | 7/1996 | Durand et al. ................ 29/840 |
| 5,574,309 | A | | 11/1996 | Papapietro et al. ......... 257/679 |
| 5,581,498 | A | | 12/1996 | Ludwig et al. ............... 365/63 |
| 5,582,858 | A | | 12/1996 | Adamopoulos et al. ....... 427/96 |
| 5,616,422 | A | | 4/1997 | Ballard et al. .............. 428/621 |
| 5,637,832 | A | | 6/1997 | Danner ....................... 174/260 |
| 5,674,785 | A | | 10/1997 | Akram et al. ............... 437/217 |
| 5,719,749 | A | | 2/1998 | Stopperan .................. 361/769 |
| 5,737,458 | A | * | 4/1998 | Wojnarowski et al. ........ 385/15 |
| 5,739,581 | A | | 4/1998 | Chillara ...................... 257/668 |
| 5,739,585 | A | | 4/1998 | Akram et al. ............... 257/698 |
| 5,739,588 | A | | 4/1998 | Ishida et al. ................ 257/782 |
| 5,742,479 | A | | 4/1998 | Asakura ..................... 361/737 |
| 5,774,340 | A | | 6/1998 | Chang et al. |
| 5,784,259 | A | | 7/1998 | Asakura ..................... 361/752 |
| 5,798,014 | A | | 8/1998 | Weber ........................ 156/263 |
| 5,822,190 | A | | 10/1998 | Iwasaki ...................... 361/737 |
| 5,826,330 | A | | 10/1998 | Isoda et al. ................... 29/852 |
| 5,835,355 | A | | 11/1998 | Dordi ......................... 361/760 |
| 5,847,453 | A | | 12/1998 | Uematsu et al. |
| 5,894,108 | A | | 4/1999 | Mostafazadeh et al. .... 174/52.4 |
| 5,903,052 | A | | 5/1999 | Chen et al. ................. 257/706 |
| 5,936,843 | A | | 8/1999 | Ohshima et al. ............ 361/760 |
| 5,952,611 | A | | 9/1999 | Eng et al. .................. 174/52.4 |
| 6,004,619 | A | | 12/1999 | Dippon et al. ................ 427/97 |
| 6,013,948 | A | | 1/2000 | Akram et al. ............... 257/698 |
| 6,021,564 | A | | 2/2000 | Hanson ........................ 29/852 |
| 6,028,364 | A | | 2/2000 | Ogino et al. ................ 257/778 |
| 6,034,427 | A | | 3/2000 | Lan et al. ................... 257/698 |
| 6,040,622 | A | | 3/2000 | Wallace ...................... 257/679 |
| 6,060,778 | A | | 5/2000 | Jeong et al. ................. 257/710 |
| 6,068,782 | A | * | 5/2000 | Brandt et al. ................. 216/17 |
| 6,069,407 | A | | 5/2000 | Hamzehdoost .............. 257/774 |
| 6,072,243 | A | | 6/2000 | Nakanishi ................... 257/783 |
| 6,081,036 | A | | 6/2000 | Hirano et al. |
| 6,119,338 | A | | 9/2000 | Wang et al. ................... 29/852 |
| 6,122,171 | A | | 9/2000 | Akram et al. ............... 361/704 |
| 6,127,833 | A | | 10/2000 | Wu et al. .................... 324/755 |
| 6,160,705 | A | | 12/2000 | Stearns et al. .............. 361/704 |
| 6,172,419 | B1 | | 1/2001 | Kinsman .................... 257/737 |
| 6,175,087 | B1 | | 1/2001 | Keesler et al. |
| 6,184,463 | B1 | | 2/2001 | Panchou et al. ........... 174/52.4 |
| 6,204,453 | B1 | | 3/2001 | Fallon et al. |
| 6,214,641 | B1 | | 4/2001 | Akram ........................ 438/107 |
| 6,235,554 | B1 | | 5/2001 | Akram et al. ............... 438/109 |
| 6,239,485 | B1 | | 5/2001 | Peters et al. |
| D445,096 | S | | 7/2001 | Wallace ..................... D14/117 |
| D446,525 | S | | 8/2001 | Okamoto et al. .......... D14/436 |
| 6,274,821 | B1 | | 8/2001 | Echigo et al. .............. 174/255 |
| 6,280,641 | B1 | | 8/2001 | Gaku et al. .................... 216/17 |
| 6,280,907 | B1 | * | 8/2001 | Chung et al. ............... 430/313 |
| 6,316,285 | B1 | | 11/2001 | Jiang et al. ................. 438/106 |
| 6,351,031 | B1 | | 2/2002 | Iijima et al. |
| 6,353,999 | B1 | | 3/2002 | Cheng ........................... 29/852 |
| 6,365,975 | B1 | | 4/2002 | DiStefano et al. |
| 6,376,906 | B1 | | 4/2002 | Asai et al. |
| 6,392,160 | B1 | | 5/2002 | Andry et al. ................ 174/261 |
| 6,395,578 | B1 | | 5/2002 | Shin et al. ................... 438/106 |
| 6,405,431 | B1 | | 6/2002 | Shin et al. .................... 29/852 |
| 6,406,942 | B2 | | 6/2002 | Honda ........................ 438/119 |
| 6,407,341 | B1 | | 6/2002 | Anstrom et al. ............ 174/255 |
| 6,407,930 | B1 | | 6/2002 | Hsu ............................ 361/784 |
| 6,451,509 | B2 | | 9/2002 | Keesler et al. .............. 430/311 |
| 6,479,762 | B2 | | 11/2002 | Kusaka ....................... 174/261 |
| 6,497,943 | B1 | | 12/2002 | Jimarez et al. ............. 428/209 |
| 6,517,995 | B1 | | 2/2003 | Jacobson et al. ........... 430/320 |
| 6,534,391 | B1 | | 3/2003 | Huemoeller et al. ........ 438/612 |
| 6,544,638 | B2 | | 4/2003 | Fischer et al. ............ 428/322.7 |
| 6,586,682 | B2 | | 7/2003 | Strandberg ................. 174/255 |
| 6,608,757 | B1 | | 8/2003 | Bhatt et al. |
| 6,660,559 | B1 | | 12/2003 | Huemoeller et al. ........ 438/106 |
| 6,715,204 | B1 | | 4/2004 | Tsukada et al. ............... 29/847 |
| 6,727,645 | B2 | | 4/2004 | Tsujimura et al. .......... 313/504 |
| 6,730,857 | B2 | | 5/2004 | Konrad et al. .............. 174/257 |
| 6,753,612 | B2 | | 6/2004 | Adae-Amoakoh et al. .. 257/774 |
| 6,787,443 | B1 | | 9/2004 | Boggs et al. ............... 438/612 |
| 6,803,528 | B1 | | 10/2004 | Koyanagi .................... 174/262 |
| 6,815,709 | B2 | | 11/2004 | Clothier et al. |
| 6,815,739 | B2 | | 11/2004 | Huff et al. ................... 257/275 |
| 2002/0017712 | A1 | | 2/2002 | Bessho et al. .............. 257/700 |
| 2003/0128096 | A1 | | 7/2003 | Mazzochette ................. 338/22 |

FOREIGN PATENT DOCUMENTS

| | | |
|---|---|---|
| JP | 05-136323 | 6/1993 |
| JP | 07-017175 | 1/1995 |
| JP | 08-190615 | 7/1996 |
| JP | 10-334205 | 12/1998 |

* cited by examiner

METHOD FOR MAKING AN INTEGRATED CIRCUIT SUBSTRATE HAVING EMBEDDED PASSIVE COMPONENTS

CROSS-REFERENCE TO RELATED APPLICATIONS

The present application is a divisional of U.S. patent application Ser. No. 10/319,022 entitled "INTEGRATED CIRCUIT SUBSTRATE HAVING EMBEDDED PASSIVE COMPONENTS AND METHODS THEREFOR" filed on Dec. 12, 2002, now U.S. Pat. No. 6,987,661, issued Jan. 17, 2006, which is a Continuation-in-Part of U.S. patent application entitled "INTEGRATED CIRCUIT SUBSTRATE HAVING LASER-EMBEDDED CONDUCTIVE PATTERNS AND METHOD THEREFOR", Ser. No. 10/138,225 filed May 1, 2002, now U.S. Pat. No. 6,930,256, issued Aug. 16, 2005, and having at least one common inventor and assigned to the same assignee. The Parent continuation-in-part application is also a continuation-in-part of U.S. patent application entitled "IMPRINTED INTEGRATED CIRCUIT SUBSTRATE AND METHOD FOR IMPRINTING AN INTEGRATED CIRCUIT SUBSTRATE", Ser. No. 09/884,193 filed Jun. 19, 2001, now U.S. Pat. No. 6,967,124, issued Nov. 22, 2005, by the same inventors and assigned to the same assignee. The specifications of the above-referenced patent applications are herein incorporated by reference.

FIELD OF THE INVENTION

The present invention relates generally to semiconductor packaging, and more specifically, to a substrate having embedded passive components and various methods for making such a substrate.

BACKGROUND OF THE INVENTION

Semiconductors and other electronic and opto-electronic assemblies are fabricated in groups on a wafer. Known as "dies", the individual devices are cut from the wafer and are then bonded to a carrier. The dies must be mechanically mounted and electrically connected to a circuit. For this purpose, many types of packaging have been developed, including "flip-chip", ball grid array and leaded grid array among other mounting configurations. These configurations typically use a planar printed circuit etched on the substrate with bonding pads and the connections to the die are made by either wire bonding or direct solder connection to the die.

In certain applications, passive components such as resistors and capacitors are required for use in conjunction with the circuits integrated within the die. Depending on the size of and power dissipation within the integrated circuit, and also the integrated circuit fabrication technology, it may not be possible to integrate the passive components within the die. Further, for design of die for use with a variable range of passive components (e.g., passive components that set variable frequency characteristics or current levels) it may not be desirable to integrate the passive components within the die.

Therefore in some applications it is necessary to mount the passive components external to the die, but still desirable to mount the passive components within the integrated circuit package. Presently, in-package mounting is accomplished by integrating surface mount packaged passive components or less frequently leaded passive components on the substrate. However, such mounting of passive components entails not only an added component cost, but the package of the passive component consumes volume and forces the mechanical design to be adjusted to accommodate the physical size and shape of the passive components. The surface mounting of such components also may determine the overall height of the semiconductor package, which is a critical factor in compact electronic designs such as cellular telephones, memory cards and other portable and/or compact electronic devices.

Therefore, it would be desirable to provide a method and substrate having integrated passive components with a low impact on package volume and height. It would further be desirable to provide a method and substrate having reduced manufacturing cost associated with integration of passive components.

SUMMARY OF THE INVENTION

A substrate having embedded passive components and methods for manufacturing provide a compact integrated circuit package with low incremental cost associated with integrating passive components.

The substrate includes one or more insulating layers in which one or more embossed or laser-ablated apertures are formed. A paste is applied that forms the bodies of passive components. A resistive paste is used to form resistor bodies within apertures that may be embossed or laser embedded in the insulating layer. The ends of the resistive body may be coupled to conductive paste circuit patterns consistent with those described in the above-incorporated patent applications.

Capacitors are formed by applying a dielectric paste within apertures after the bottoms of the apertures are covered by a metal plating. A doped substrate material may be embossed and the bottom surface of embossed apertures activated via a laser or plasma stimulation to subsequently selectively plate the bottom surface of the aperture without depositing conductive material on the side walls of the apertures. The dielectric paste may be doped and top surfaces of the paste activated after curing to selectively plate the top surface of the capacitor bodies. Disjoint plates may be used to provide a via connection through from the bottom plates of the capacitors.

The dielectric paste may be deposited to overfill the aperture and duct ablated, then the top surface activated and plated. The top plated surface and the balance of the substrate may then covered with a pre-preg material to completely embed the capacitor and permit connection using a via or by blind vias formed by ablating a conductor channel through the pre-preg material to the top plate of the capacitor. Alternatively, the dielectric paste may be applied within the aperture, cured and then laser ablated to both activate the top surface and to planarize the top surface beneath the top plane of the substrate. Then, a pre-preg material may be applied to embed the capacitor as described above, or if the plated top plate of the capacitor is properly aligned, a circuit channel may be ablated in the substrate surface abutting the top plate and a connection formed to the top plate of the capacitor by application of conductive paste or plating within the channels.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

The above-incorporated patent applications disclose processes and structures for manufacturing a low-cost integrated circuit substrate having embedded circuit conductors. The present invention provides processes and structures for embedding and connecting passive components within such substrates, providing substrates with greatly expanded functionality at a lower cost than alternative circuits incorporating discrete passive components. The density of circuits is further improved using the techniques of the present invention and yield a higher density circuit integration than traditional discrete passive component techniques, as not only are the passive components moved inside of the semiconductor package, but typical interconnect and packaging areas and volumes associated with discrete passive components are eliminated. Packaging of passive components in the present invention is provided by the substrate within the semiconductor package, and the passive component interconnects are provided by the same interconnect technology employed to interconnect the die to external terminals.

Figure 1A:
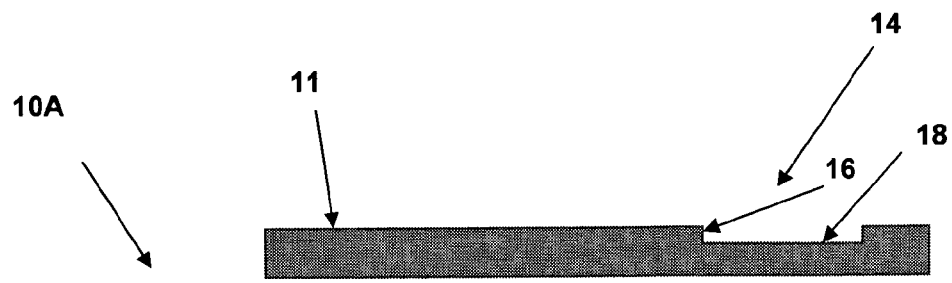
FIG. 1A is a pictorial diagram depicting a cross sectional side view and FIG. 1B is a pictorial diagram depicting a top view of a stage in preparation of a substrate in accordance with an embodiment of the invention.
Figure 1B:
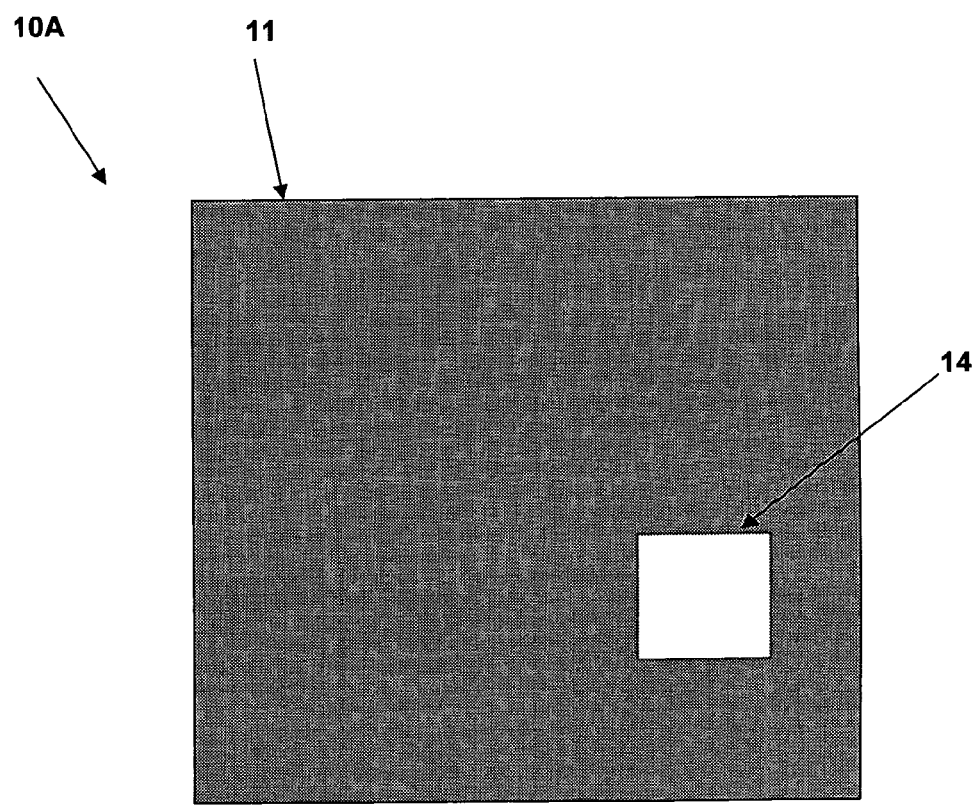

Referring now to FIGS. 1A and 1B, a substrate 10A illustrating a first step of preparation in accordance with an embodiment of the invention is depicted. The depictions in the above Figures and in those that follow show fabrication of a single resistor and a single capacitor within substrate 10A, but any number and combinations of resistors and/or capacitors may be fabricated using techniques disclosed and claimed herein. Substrate 10A is fabricated from an embossable resin insulating layer and embossed to provide insulating layer 11.

Aperture 14 is formed within insulating layer 11, providing a cavity for fabrication of a passive component. Aperture 14 illustrates a cavity for a capacitor body, which will generally be larger than an aperture for forming a resistor. Aperture 14 is formed by embossing a resin layer using an embossing tool to generate a depression (cavity) in insulating layer 11. If only resistors are to be fabricated, apertures may be formed by laser or plasma ablation, but the illustrated embodiment uses a doped insulating layer 11 that contains a palladium complex and surfaces will be selectively activated for electro-less plating in subsequent steps for forming capacitors. If laser ablation were used to form capacitor aperture 14, the side walls 16 would be activated as well as the bottom 18 of aperture 14, which is an undesirable condition as will be illustrated in subsequent stages in the substrate preparation.

Figure 2A:
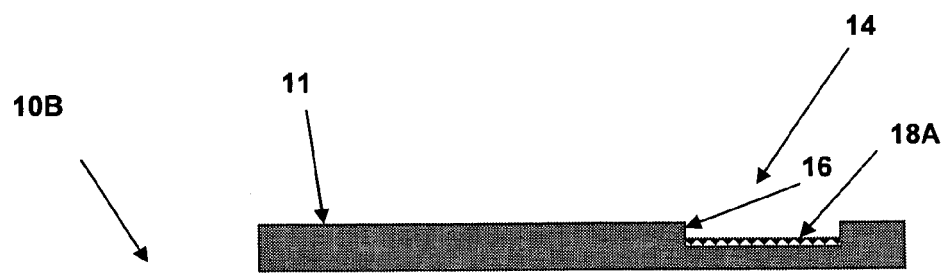
FIG. 2A is a pictorial diagram depicting a cross sectional side view and FIG. 2B is a pictorial diagram depicting a top view of a next stage in preparation of a substrate in accordance with an embodiment of the invention.
Figure 2B:
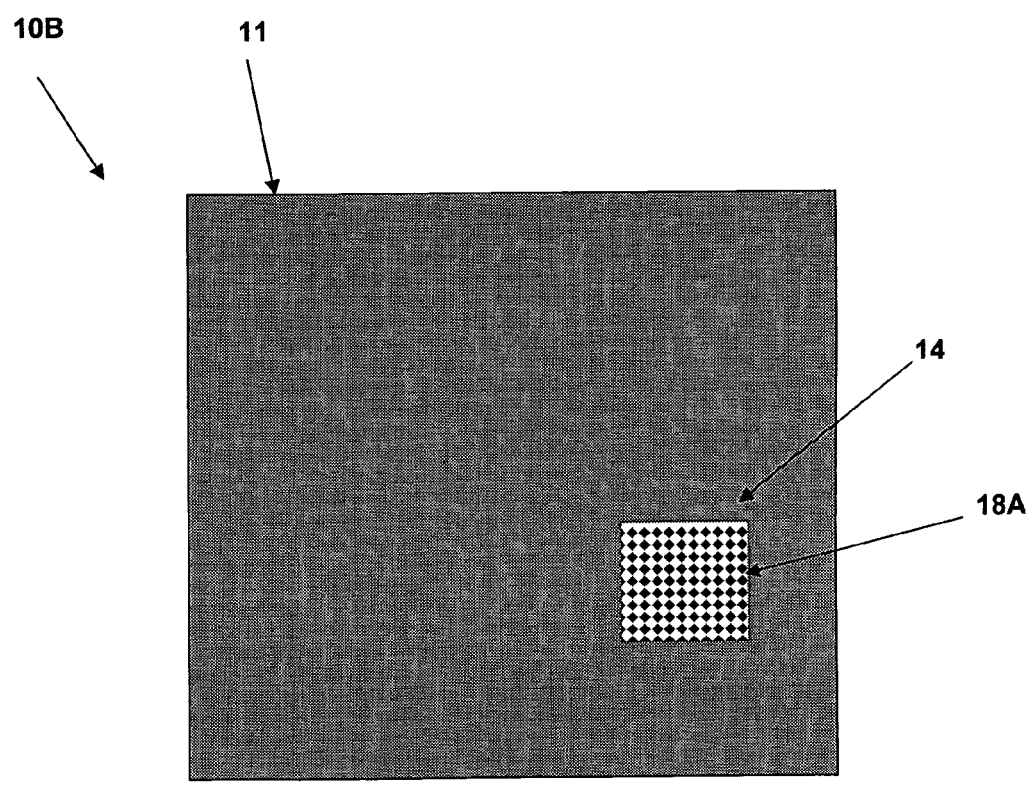
Figure 3A:
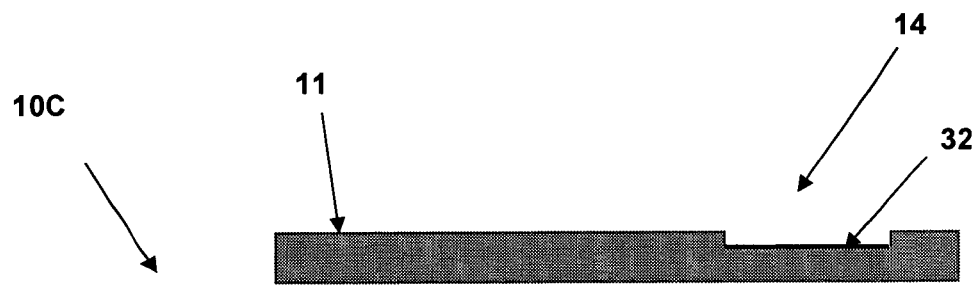
FIG. 3A is a pictorial diagram depicting a cross sectional side view and FIG. 3B is a pictorial diagram depicting a top view of a further stage in preparation of a substrate in accordance with an embodiment of the invention.
Figure 3B:
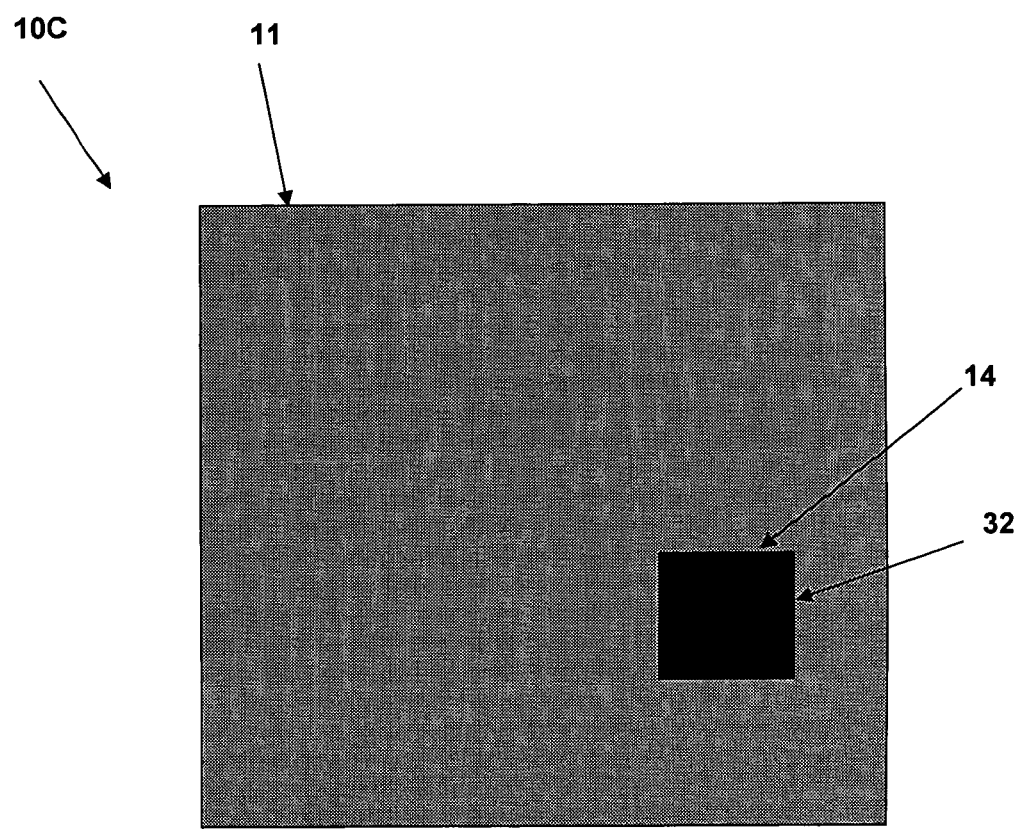

Referring now to FIGS. 2A and 2B, a substrate 10B illustrating a next step of preparation in accordance with an embodiment of the invention is depicted. Bottom 18 of substrate 10A is laser or plasma activated, leaving a reduced palladium layer 18A in the bottom of aperture 14. Next, referring to FIGS. 3A and 3B, substrate 10B is dipped in an electro-less plating solution, and copper is deposited on palladium layer 18A, forming a bottom plate 32 of a capacitor at the bottom of aperture 14.

Figure 4A:
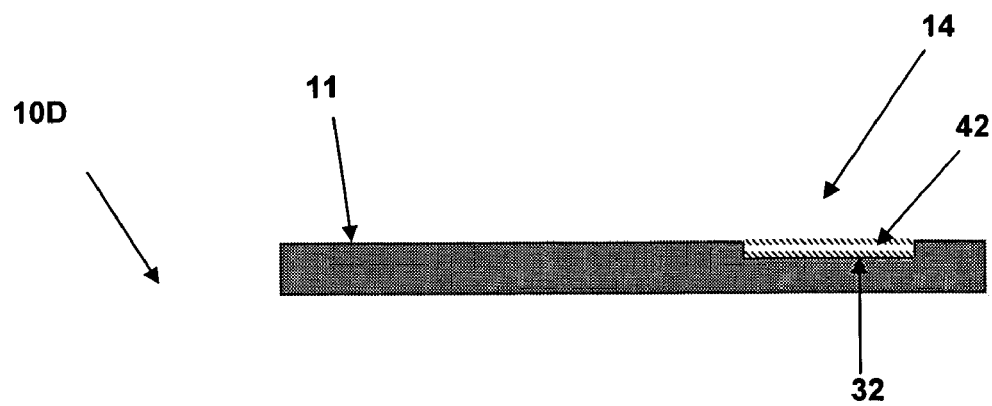
FIG. 4A is a pictorial diagram depicting a cross sectional side view and FIG. 4B is a pictorial diagram depicting a top view of a yet further stage in preparation of a substrate in accordance with an embodiment of the invention.
Figure 4B:
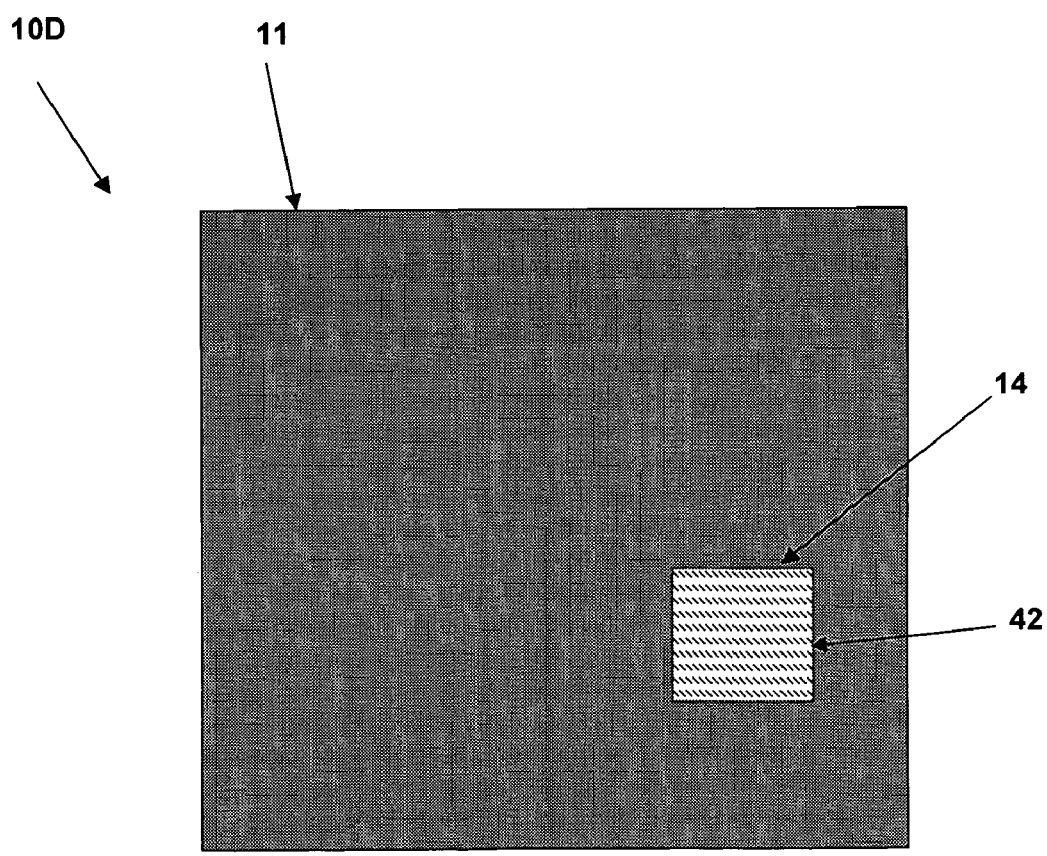

Next, referring now to FIGS. 4A and 4B, a doped dielectric paste 42 is applied within aperture 14 to form the body of the capacitor. (A doped dielectric paste is used to provide a mechanism for forming a top plate on the capacitor in subsequent steps, and it is possible with electro-plating or other technique to form a top plate on the capacitor, thus removing the requirement for a doped dielectric.) The doped dielectric paste may be a barium titanate paste and palladium complex mixture. In general, mixture percentages range from 0.5% to 2.0% doping in general use for resin compounds as used for the substrate above and similar doping concentrations in a barium titanate mixture will provide sufficient palladium concentration at the surface of the dielectric for plating.

Suitable palladium complexes for use in dielectric paste and in insulating layer 11 are:

Bis-8-diketonate paladium complex (Pd[R1(CO)CH(CO)R2]2),

Tris(4,4'-(2,3 epoxypropoxy)dibenzylideneacetone)Pd(0)(1)

Bis(1-phenyl-1,3-butanedionato)Pd(2)

Bis(1,3-diphenyl-1,3-propanedionato)Pd(2)

but any organometallic compound that is electrically non-conducting, sufficiently soluble and/or colloidal-dispersible in a polymer matrix, has no catalytic properties and is separable in metal seeds and organic residuals by laser or plasma ablation may be usable. High thermal resistance is desirable for controlling activation area.

Figure 5A:
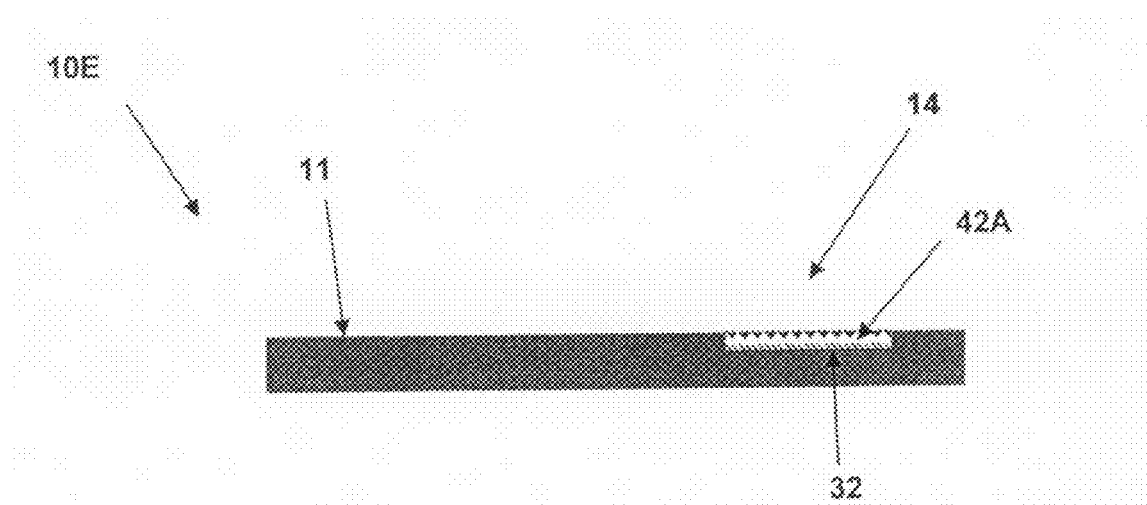
FIG. 5A is a pictorial diagram depicting a cross sectional side view and FIG. 5B is a pictorial diagram depicting a top view of a next stage in preparation of a substrate in accordance with an embodiment of the invention.
Figure 5B:
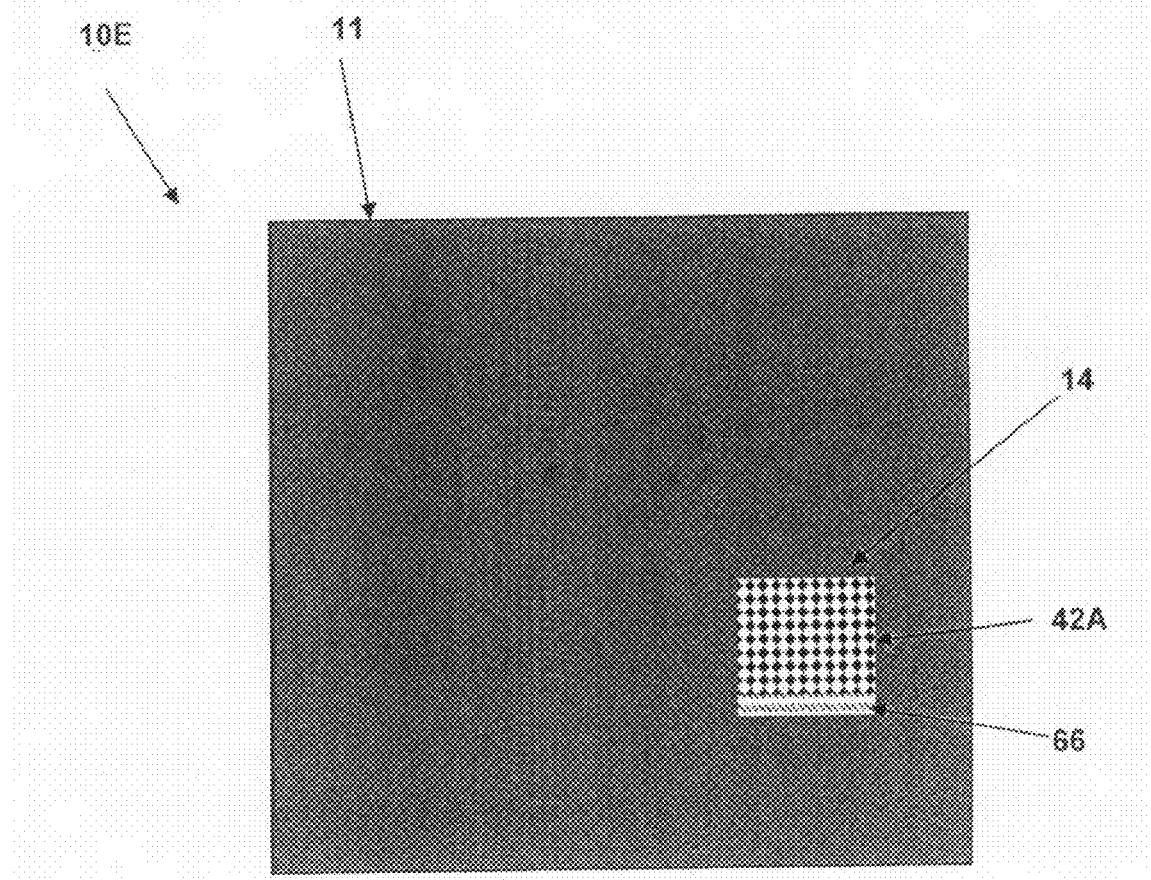
Figure 6A:
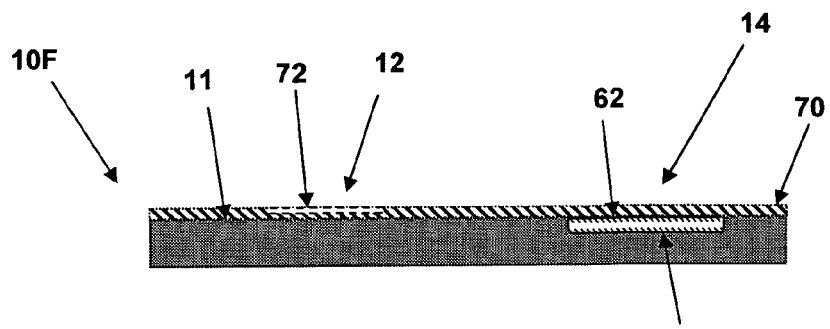
FIG. 6A is a pictorial diagram depicting a cross sectional side view and FIG. 6C is a pictorial diagram depicting a top view of a further stage in preparation of a substrate in accordance with an embodiment of the invention.
Figure 6B:
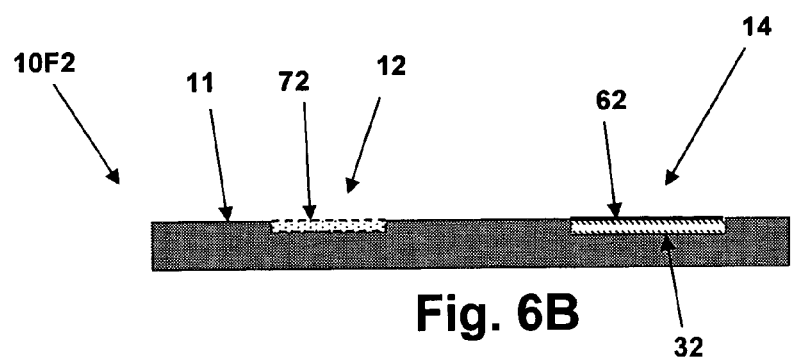
FIG. 6B is a pictorial diagram depicting a cross sectional side view of a further stage in preparation of a substrate in accordance with an alternative embodiment of the invention.

Referring now to FIGS. 5A and 5B, after dielectric paste 42 is applied, the dielectric paste is planarized by duct-ablation (using a squeegee, roller or other technique) and then dielectric paste 42 is cured. Then, dielectric paste 42 is activated using a laser, leaving active surface 42A. Substrate 10D can then be electro-less plated as shown in FIGS. 6A and 6B to form a second (top) plate 62 of the capacitor. As illustrated, active surface 42A may be tailored to provide a top-plating free region 66 through which a via may pass for connection to bottom capacitor plate 32.

Alternatively, dielectric paste 42 is cured and then planarized using a laser or plasma ablation technique, which may be performed in conjunction with (or after manual inspection of) a scanning electron microscope (SEM) image or other inspection technique such as laser reflectometry. The capacitors can be made thinner using the SEM or laser surface profiling, providing high capacitance values having lower height and volume than comparable discrete capacitors. After the top of dielectric 42 is planarized, an active surface 42A is left and substrate 10D can then be electro-less plated as shown in FIGS. 6A and 6B to form a second (top) plate 62 of the capacitor. As illustrated, active surface 42A may be tailored to provide a top-plating free region 66 through which a via may pass for connection to bottom capacitor plate 32.

Additionally, as the substrate material is typically thicker than dielectric fabrication limits for the capacitors, multi-layer capacitors can be fabricated using the above-described laser-structuring process, thus increasing the effective area by a unit factor and decreasing the plate separation distance. The laser structuring alternative process permits placing an intermediate plate (with a corresponding via connection in the final assembly) at a fraction of the height of aperture 14 and adding other intermediate plates via an activation/plating process until at a point near or at the top of the substrate, top plate 62 is generated.

The above-described multi-layer technique generates capacitors with much larger capacitance values. For example, a 50 mil thick substrate can contain a two-layer capacitor having plate separated by half of the substrate thickness and if a central ground plane is already present, either two discrete capacitors having twice the capacitance of a full-height capacitor or a parallel combination having four times the capacitance may be fabricated in the same surface area.

Figure 6C:
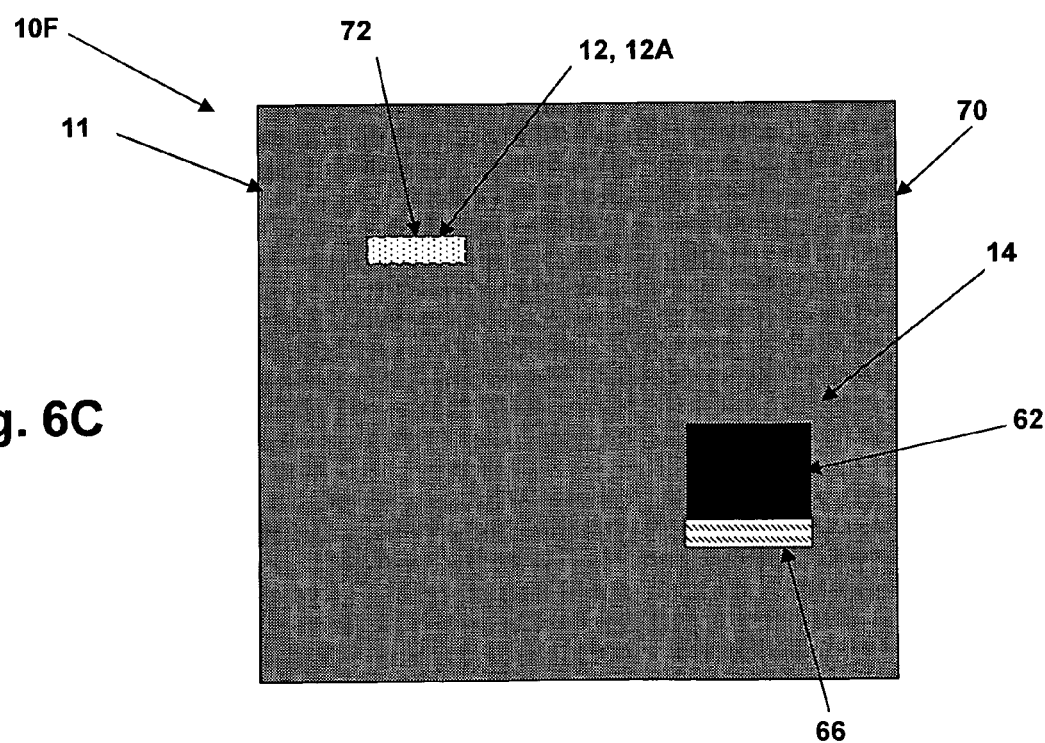

Once any capacitors have been formed, the resistors and conductive patterns may be formed on substrate 10E. Referring now to FIGS. 6A and 6C, a pre-preg material 70 is applied over insulating layer 11 to form substrate 10F and embedding the capacitor within substrate 10F. At this time, an aperture 12 may be formed for fabrication of a resistor by embossing pre-preg material 70 prior to curing. (Alternatively pre-preg material 70 may be laser-ablated after curing.) A resistive paste is then deposited and duct-ablated to form the body of the resistors.

Referring now to FIG. 6B, an alternative embodiment of the substrate that does not include a pre-preg layer is shown. An aperture 12A is laser ablated in insulating layer 11 forming substrate 10F2, so that a resistor may be formed directly on the surface of insulating layer 11 by depositing and duct-ablating resistive paste 72. Another alternative is to pre-emboss (or laser-ablate) aperture 12A during the preparation of substrate 10A, but aperture 14 and aperture 12 must be selectively masked for the paste and duct-ablation operations that apply resistive paste and dielectric. Generally the substrates will be fabricated in large panels and the paste applied across the entire panel, making it necessary to mask the panel to avoid depositing the first-applied paste in the incorrect apertures.

Yet another embodiment of the present invention includes a substrate prepared as shown in FIG. 6B, but with a prepreg layer applied over resistors and capacitors. In embodiments where the resistors are completely embedded, blind via and/or through via connections as described below are used to make connections to the resistor bodies as well as to the embedded capacitor plates.

Figure 7A:
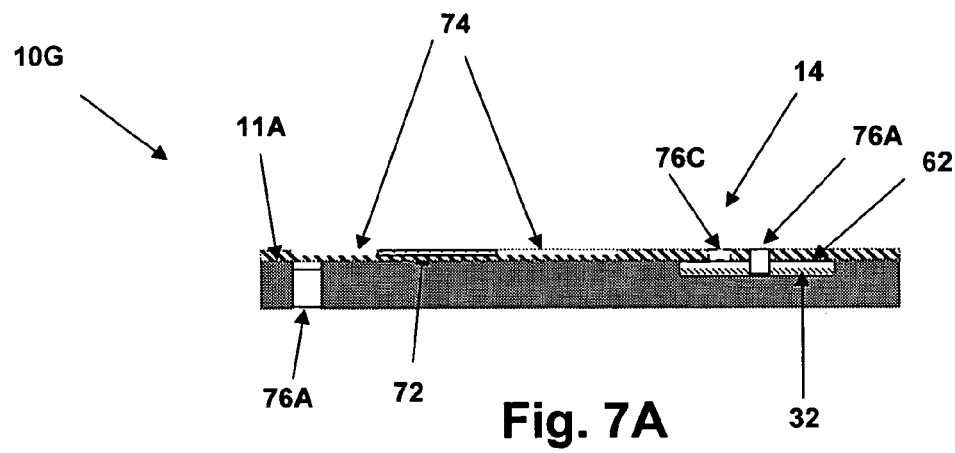
FIG. 7A is a pictorial diagram depicting a cross sectional side view and FIG. 7C is a pictorial diagram depicting a top view of another stage in preparation of a substrate in accordance with an embodiment of the invention.
Figure 7B:
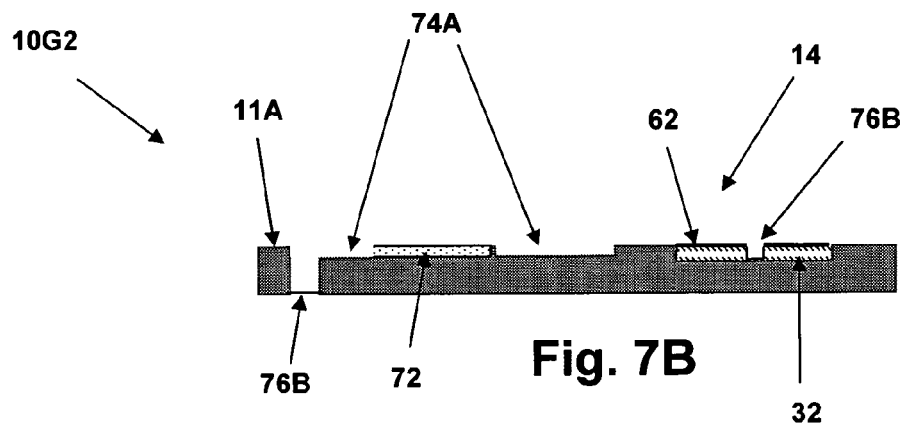
FIG. 7B is a pictorial diagram depicting a cross sectional side view of another stage in preparation of a substrate in accordance with an alternative embodiment of the invention.
Figure 7C:
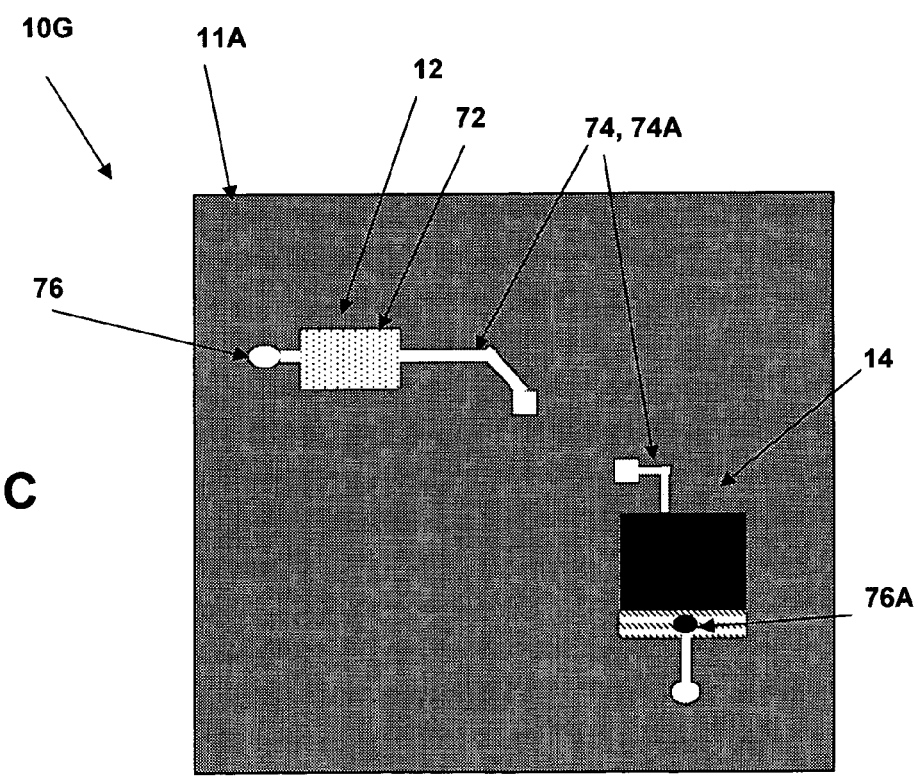

Next, referring to FIGS. 7A and 7C, channels 74 are formed in prepreg material layer 70 (after resistor body 72 has been cured) by laser ablation or embossing and plated to form conductive patterns for electrically interconnecting the passive components and other circuits. Alternatively, referring to FIG. 7B, if a prepreg layer is not used, channels 74A are formed by laser-ablation, directly on the top surface of insulating layer 11A for forming conductive patterns.

For embodiments including pre-preg material layer 70, vias 76A may be drilled and used to connect conductive patterns to bottom plate 32 and top plate 62 of a capacitor, or a blind via 76C as shown in FIG. 7A may be used for connection to the top plate by ablating a channel over or adjacent to top plate 62 to a depth exposing top plate 62 to a subsequently applied conductor within the channel.

Formation of conductive patterns is described in the above-incorporated parent applications. Either a scanned laser such as a YAG laser may be used to generate the patterns, or an eximer pulsed laser may be used in combination with a mask having the conductive patterns translucent thereon to provide simultaneous generation of the circuit pattern. The advantage of the mask/pulsed laser technique is that the speed or intensity of the scanned laser needs to be controlled over the range of channel widths and depth to be produced in the substrate, where the mask/pulsed laser technique implicitly produces the pattern with uniform depth.

Figure 8A:
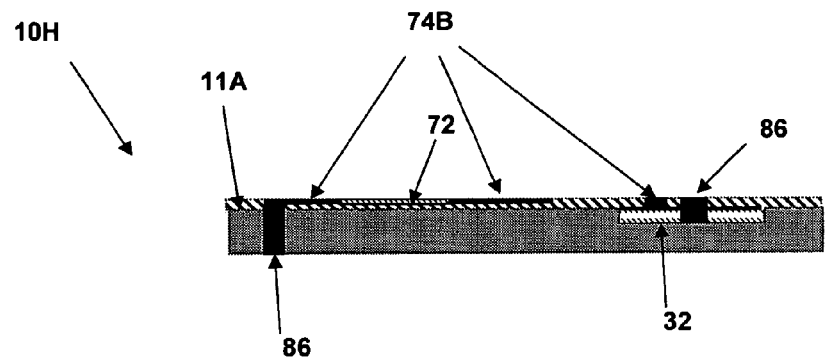
FIG. 8A is a pictorial diagram depicting a cross sectional side view and FIG. 8C is a pictorial diagram depicting a top view of a completed substrate in accordance with an embodiment of the invention.
Figure 8B:
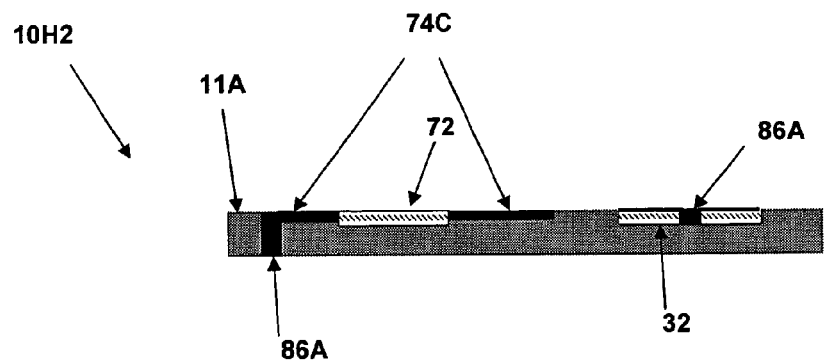
FIG. 8B is a pictorial diagram depicting a cross sectional side view of a completed substrate in accordance with an alternative embodiment of the invention.
Figure 8C:
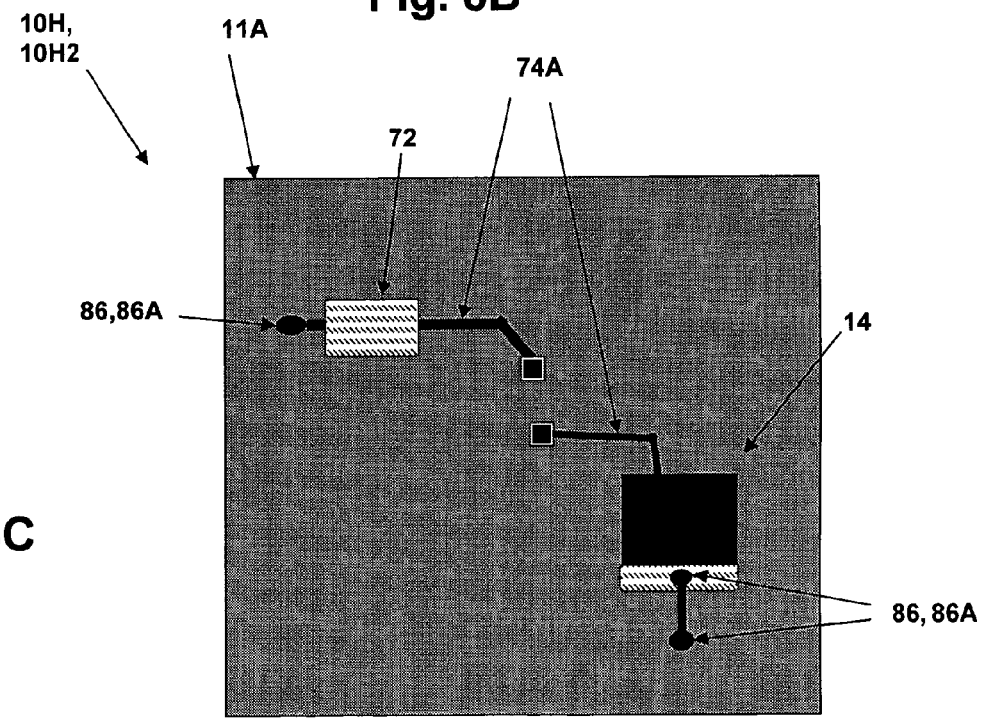

Referring now to FIGS. 8A, 8B and 8C, conductive paste is applied within channels 74 (or 74A) to form conductive patterns 74B (or 74C) and within holes 76A (or 76B) to form vias 86 (or 86A). Conductive patterns 74B (or 74C) contact resistor body 72 and capacitor top plate 62 to provide electrical connections for the passive components. Alternatively, a plating process may be used to form the conductive patterns as described in the above-incorporated patent applications.

Figure 9A:
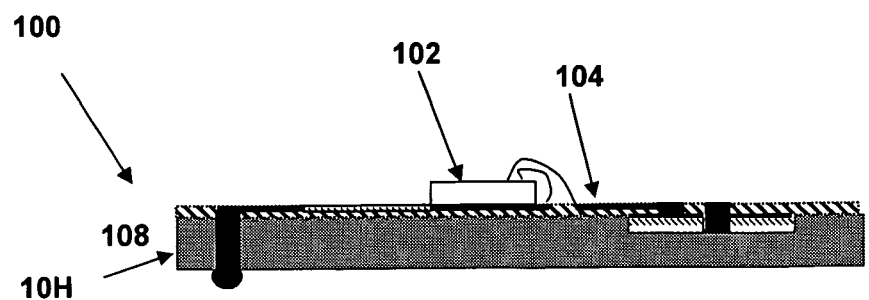
FIG. 9A is a pictorial diagram depicting a cross sectional side view and FIG. 9C is a pictorial diagram depicting a top view of an integrated circuit in accordance with an embodiment of the invention.
Figure 9B:
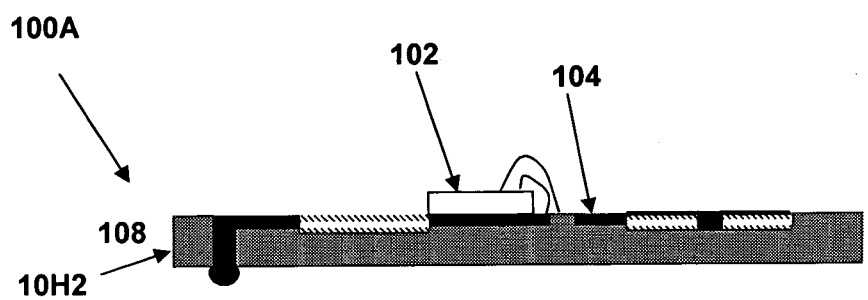
FIG. 9B is a pictorial diagram depicting a cross sectional side view of an integrated circuit in accordance with an alternative embodiment of the invention.
Figure 9C:
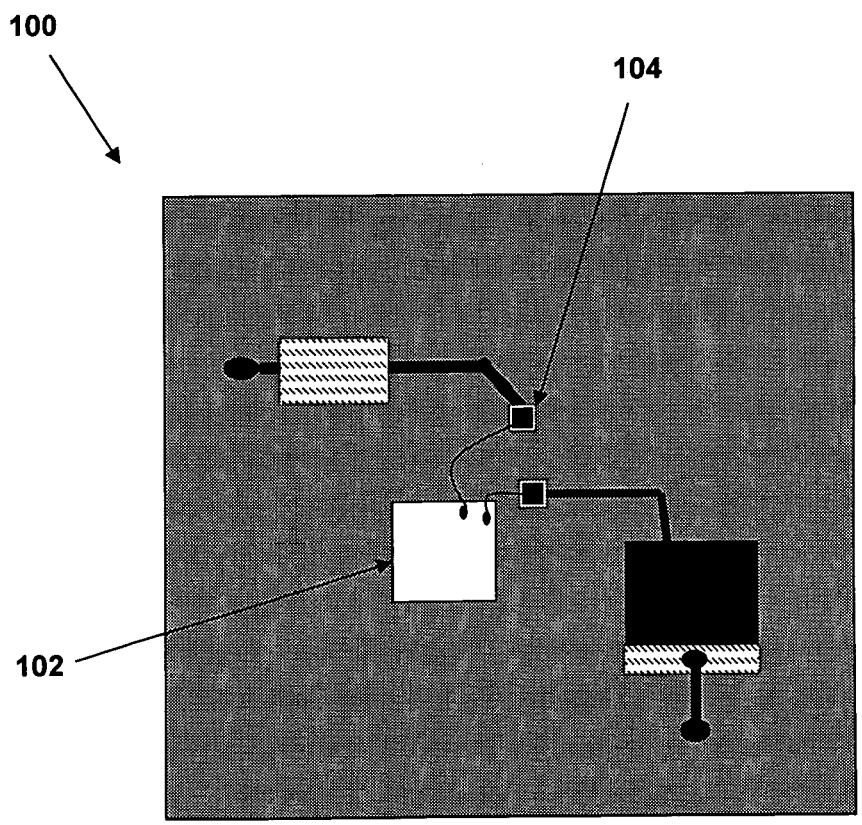

Referring now to FIGS. 9A and 9C, an integrated circuit 100 in accordance with an embodiment of the invention is depicted and in FIG. 9B an integrated circuit 100A in accordance with an alternative embodiment of the invention is depicted. One or more dies 102 is/are attached to substrate 10G and depending on the die bonding type, wire-bonded or post mounted to contact pads 104 connected to conductive patterns 74A. Solder balls or lands 108 are attached to vias (or conductive patterns on the bottom side of substrate 10G not shown) to provide terminals for electrical connection to external circuits and mechanical mounting of the integrated circuit.

The techniques illustrated above may be applied to multilayer circuits by providing insulating layers (film or deposited coating) between layers of conductive patterns and passive components, providing a stackable passive component and interconnect technology. The above-disclosed techniques provide capacitors and resistors that are lower cost, have precision values and are conservative of area and volume as they do not include extra packaging volume associated with discrete components.

The above description of embodiments of the invention is intended to be illustrative and not limiting. Other embodiments of this invention will be obvious to those skilled in the art in view of the above disclosure and fall within the scope of the present invention.

What is claimed is:

1. A method of forming a passive component within at least one insulating layer of a semiconductor integrated circuit substrate, the method comprising:
    forming an aperture within the at least one insulating layer, the aperture having a bottom above a bottom of the substrate;
    laser-activating only the bottom of the aperture;
    electroless-plating the bottom of the aperture;
    depositing a paste within the aperture to form a body of the passive component; and
    plating a top surface of the body to complete the passive component.

2. The method of claim 1, further comprising depositing a pre-preg layer over the insulating layer and the body of the passive component.

3. The method of claim 2, further comprising:
    forming channels within the pre-preg layer;
    depositing conductive material within the channels to form a plurality of conductive patterns; and
    forming vias through to the passive component from the plurality of conductive patterns.

4. The method of claim 3, wherein the forming channels is performed by laser-ablating the channels.

5. The method of claim 3, wherein the forming channels is performed by embossing the channels.

6. The method of claim 2, further comprising:
    forming one or more apertures within the pre-preg layer; and
    applying a resistive paste within the one or more apertures to form a plurality of resistors.

7. The method of claim 1, wherein the forming an aperture is performed by laser-ablating the aperture.

8. The method of claim 1, wherein the forming an aperture is performed by embossing the aperture.

9. The method of claim 1 further comprising:
    applying a pre-preg layer to a top surface of the substrate;
    forming apertures within the pre-preg layer;
    depositing a resistive paste within the apertures to form bodies of a plurality of resistors;
    forming channels in the prepreg layer abutting the resistor bodies; and
    applying conductive material within the channels to form electrical connections to the resistors.

10. A method of forming a capacitor within at least one insulating layer of a semiconductor integrated circuit substrate, the method comprising:
    forming an aperture within the at least one insulating layer;
    plating a bottom of the aperture to form a first plate of the capacitor; and
    depositing a dielectric paste within the aperture to form a body of the capacitor, wherein the insulating layer is a doped insulating layer, and wherein the method further comprises activating the bottom of the aperture exclusive of side walls of the aperture, and wherein the plating is performed via an electro-less plating that deposits metal on the activated bottom of the aperture exclusive of the side walls.

11. The method of claim 10, wherein the dielectric paste is a doped dielectric paste, and wherein the method further comprises:
    activating a top of the dielectric paste; and
    plating the activated top of the dielectric paste with an electro-less plating process.

12. The method of claim 11, wherein the activating a top is performed by exposing the top of the dielectric paste to laser radiation.

13. The method of claim 10, wherein the activating is performed by exposing the bottom of the aperture to laser radiation.

14. The method of claim 10, further comprising planarizing a top of the paste-formed body of the capacitor.

15. A method of forming a capacitor within at least one insulating layer of a semiconductor integrated circuit substrate, the method comprising:
    forming an aperture within the at least one insulating layer;
    plating a bottom of the aperture to form a first plate of the capacitor;
    depositing a dielectric paste within the aperture to form a body of the capacitor;
    laser ablating the dielectric paste to planarize the dielectric paste at a level beneath a top surface of the insulating layer; and
    plating the top of the dielectric paste to form a second plate of the capacitor.

16. The method of claim 15, further comprising applying a pre-preg material to fill the aperture above the level of the second plate of the capacitor to completely embed the capacitor.

17. The method of claim 15, further comprising:
    applying a second dielectric paste above the second plate of the capacitor to form a second capacitor body; and
    plating a top surface of the second capacitor body to form a second capacitor, wherein the plating on the top surface of the second capacitor body forms a second plate of the second capacitor, and wherein the second plate of the capacitor is a first plate of the second capacitor.

18. The method of claim 17, further comprising electrically connecting the first plate of the capacitor to the second plate of the second capacitor, whereby the capacitor and the second capacitor are connected in parallel to increase a possible capacitance for a given surface area of the aperture.

19. A method of forming a substrate for a semiconductor package, the substrate having embedded passive components, the method comprising:
    forming apertures within at least one insulating layer of the substrate, the apertures having bottoms above a bottom of the substrate;
    laser-activating only the bottoms of the apertures;
    electroless-plating the bottoms of the apertures;
    depositing a paste within the apertures to form bodies of a plurality of capacitors; and
    plating top surfaces of the bodies to complete the capacitors.

* * * * *

UNITED STATES PATENT AND TRADEMARK OFFICE
CERTIFICATE OF CORRECTION

| | | |
|---|---|---|
| PATENT NO. | : 7,334,326 B1 | Page 1 of 1 |
| APPLICATION NO. | : 11/078833 | |
| DATED | : February 26, 2008 | |
| INVENTOR(S) | : Ronald Patrick Huemoeller and Sukianto Rusli | |

It is certified that error appears in the above-identified patent and that said Letters Patent is hereby corrected as shown below:

On the Title page Item 75, Line 2, replace "Sukitano" with --Sukianto--.

Signed and Sealed this

Twenty-first Day of October, 2008

JON W. DUDAS
*Director of the United States Patent and Trademark Office*